US007846845B2

(12) United States Patent
Bahng et al.

(10) Patent No.: US 7,846,845 B2
(45) Date of Patent: Dec. 7, 2010

(54) INTEGRATED METHOD FOR REMOVAL OF HALOGEN RESIDUES FROM ETCHED SUBSTRATES IN A PROCESSING SYSTEM

(75) Inventors: Kenneth J. Bahng, Cupertino, CA (US); Matthew Fenton Davis, Felton, CA (US); Thorsten Lill, Santa Clara, CA (US); Steven H. Kim, Union City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 382 days.

(21) Appl. No.: 11/676,161

(22) Filed: Feb. 16, 2007

(65) Prior Publication Data
US 2008/0099040 A1    May 1, 2008

Related U.S. Application Data

(63) Continuation-in-part of application No. 11/553,132, filed on Oct. 26, 2006.

(51) Int. Cl.
*H01L 21/302* (2006.01)
*H01L 21/461* (2006.01)
*B08B 6/00* (2006.01)
*C25F 1/00* (2006.01)
*C25F 3/30* (2006.01)
*C25F 5/00* (2006.01)
*H01L 21/306* (2006.01)

(52) U.S. Cl. .................. 438/706; 438/906; 438/963; 414/935; 134/1.3; 257/E21.224; 257/E21.226; 257/E21.227

(58) Field of Classification Search ............ 438/706, 438/765, 963, 710, 714, 723–724; 216/67, 216/74, 79; 414/936; 134/1.3
See application file for complete search history.

(56) References Cited

U.S. PATENT DOCUMENTS 5,071,714 A    12/1991 Rodbell et al.
5,188,979 A    2/1993 Filipiak (Continued)

FOREIGN PATENT DOCUMENTS

JP    05-356477    12/1993
WO    WO01/51072    7/2001
WO    WO01/97257    12/2001

OTHER PUBLICATIONS

Visokay, et al., Application of HfSiON as a Gate Dielectric Material, Applied Physic. Letters, 80 (17), 3183-5, Mar. 2002.
Yee, et al., Reactive Radio Frequency Sputter Deposition of Higher Nitrides of Titanium, Zirconium and Hafnium, J. Vac. Sci. Technol. A 4(3) May/Jun. 1986, 381-7.

(Continued)

*Primary Examiner*—Savitri Mulpuri
*Assistant Examiner*—Calvin Choi
(74) *Attorney, Agent, or Firm*—Patterson & Sheridan, LLP

(57) ABSTRACT

A method and system for removing volatile residues from a substrate are provided. In one embodiment, the volatile residues removal process is performed en-routed in the system while performing a halogen treatment process on the substrate. The volatile residues removal process is performed in the system other than the halogen treatment processing chamber and a FOUP. In one embodiment, a method for volatile residues from a substrate includes providing a processing system having a vacuum tight platform, processing a substrate in a processing chamber of the platform with a chemistry comprising halogen, and treating the processed substrate in the platform to release volatile residues from the treated substrate.

27 Claims, 4 Drawing Sheets

U.S. PATENT DOCUMENTS

| | | | |
|---|---|---|---|
| 5,217,501 A * | 6/1993 | Fuse et al. | 29/25.01 |
| 5,337,207 A | 8/1994 | Jones et al. | |
| 5,356,833 A | 10/1994 | Maniar et al. | |
| 5,571,367 A * | 11/1996 | Nakajima et al. | 156/345.15 |
| 5,641,702 A | 6/1997 | Imai et al. | |
| 5,840,200 A | 11/1998 | Nakagawa et al. | |
| 6,136,211 A | 10/2000 | Qian et al. | |
| 6,184,072 B1 | 2/2001 | Kaushik et al. | |
| 6,204,141 B1 | 3/2001 | Lou | |
| 6,228,739 B1 | 5/2001 | Ha et al. | |
| 6,270,568 B1 | 8/2001 | Droopad et al. | |
| 6,297,095 B1 | 10/2001 | Muralidhar et al. | |
| 6,300,202 B1 | 10/2001 | Hobbs et al. | |
| 6,300,212 B1 | 10/2001 | Inoue et al. | |
| 6,319,730 B1 | 11/2001 | Ramdani et al. | |
| 6,326,261 B1 | 12/2001 | Tsang et al. | |
| 6,335,207 B1 | 1/2002 | Joo et al. | |
| 6,348,386 B1 | 2/2002 | Gilmer | |
| 6,414,280 B1 * | 7/2002 | Nishitani et al. | 219/411 |
| 6,440,864 B1 * | 8/2002 | Kropewnicki et al. | 438/710 |
| 6,479,801 B1 * | 11/2002 | Shigeoka et al. | 219/502 |
| 6,485,988 B2 | 11/2002 | Ma et al. | |
| 6,514,378 B1 * | 2/2003 | Ni et al. | 156/345.51 |
| 2001/0055852 A1 | 12/2001 | Moise et al. | |
| 2002/0074312 A1 | 6/2002 | Ou-Yang et al. | |
| 2003/0170986 A1 | 9/2003 | Nallan et al. | |
| 2004/0002223 A1 | 1/2004 | Nallan et al. | |
| 2004/0007561 A1 | 1/2004 | Nallan et al. | |
| 2005/0208714 A1 * | 9/2005 | Yamazaki et al. | 438/166 |

OTHER PUBLICATIONS

Davis, Matthew, "Substrate Temperature Measurement by Infrared Transmission", U.S. Appl. No. 11/676,092, filed Feb. 16, 2007.

Translation of Official Letter for Korean Patent Application No. 10-2007-0107670 dated Dec. 17, 2008 (APPM/10990 KR).

Official Letter from Chinese Patent Office, 2007101653397 dated Feb. 27, 2009.

Notice of final rejection from the Korean Intellectual Property Office dated, May 26, 2009, for corresponding Korean Patent Application No. 10-2007-0107670. A Concise Statement of Relevance is provided.

* cited by examiner

INTEGRATED METHOD FOR REMOVAL OF HALOGEN RESIDUES FROM ETCHED SUBSTRATES IN A PROCESSING SYSTEM

CROSS-REFERENCE TO RELATED APPLICATIONS

This application is a continuation-in-part of U.S. patent application Ser. No. 11/553,132, entitled "Integrated Method and Apparatus for Efficient Removal of Halogen Residues From Etched Substrates," filed on Oct. 26, 2006. This application is also related to U.S. patent application Ser. No. 11/676,092, filed Feb. 16, 2007, entitled "Substrate Temperature Measurement by Infrared Transmission", by Davis, et al. Each of the aforementioned related patent applications is herein incorporated by reference in their entireties.

BACKGROUND OF THE INVENTION

1. Field of the Invention

The present invention generally relates to a method and apparatus for fabricating devices on a semiconductor substrate. More specifically, the present invention relates to a method and apparatus for removing halogen-containing residues after plasma etching a layer on a semiconductor substrate.

2. Description of the Related Art

Ultra-large-scale integrated (ULSI) circuits may include more than one million electronic devices (e.g., transistors) that are formed on a semiconductor substrate, such as a silicon (Si) substrate, and cooperate to perform various functions within the device. Typically, the transistors used in the ULSI circuits are complementary metal-oxide-semiconductor (CMOS) field effect transistors. A CMOS transistor has a gate structure comprising a polysilicon gate electrode and gate dielectric, and is disposed between a source region and drain regions that are formed in the substrate.

Plasma etching is commonly used in the fabrication of transistors and other electronic devices. During plasma etch processes used to form transistor structures, one or more layers of a film stack (e.g., layers of silicon, polysilicon, hafnium dioxide ($HfO_2$), silicon dioxide ($SiO_2$), metal materials, and the like) are typically exposed to etchants comprising at least one halogen-containing gas, such as hydrogen bromide (HBr), chlorine ($Cl_2$), carbon tetrafluoride ($CF_4$), and the like. Such processes cause a halogen-containing residue to build up on the surfaces of the etched features, etch masks, and elsewhere on the substrate.

When exposed to a non-vacuumed environment (e.g., within factory interfaces or substrate storage cassettes) and/or during consecutive processing, gaseous halogens and halogen-based reactants (e.g., bromine ($Br_2$), chlorine ($Cl_2$), hydrogen chloride (HCl), and the like) may be released from the halogen-containing residues deposited during etching. The released halogens and halogen-based reactants create particle contamination and cause corrosion of the interior of the processing systems and factory interfaces, as well as corrosion of exposed portions of metallic layers on the substrate. Cleaning of the processing systems and factory interfaces and replacement of the corroded parts is a time consuming and expensive procedure.

Several processes have been developed to remove the halogen-containing residues on the etched substrates. For example, the etched substrate may be transferred into a remote plasma reactor to expose the etched substrate to a gas mixture that converts the halogen-containing residues to non-corrosive volatile compounds that may be out-gassed and pumped out of the reactor. However, such process requires a dedicated process chamber along with an additional step, causing increased tool expense, reduced manufacturing productivity and throughput, resulting in high manufacturing cost.

In another example halogen-containing residues may be encapsulated on the etched substrate until a time that further processing is desired, which at that time, the encapsulation is removed.

Therefore, there is a need for an improved method and apparatus for removing halogen-containing residues from a substrate.

SUMMARY OF THE INVENTION

A method and system for removing volatile residues from an etched substrate are provided. In one embodiment, a method for volatile residues from a substrate includes providing a processing system having a vacuum tight platform, processing a substrate in a processing chamber of the platform with a chemistry comprising halogen, and treating the processed substrate in the platform to release volatile residues from the treated substrate.

In another embodiment, a method for removing volatile residues from a substrate includes providing a processing system having a processing chamber and a substrate heater disposed outside the processing chamber, etching the substrate in the processing chamber with a chemistry comprising halogen, treating the etched substrate with the substrate heater while in the processing system to release volatile residues from the substrate, and detecting a change of substrate transmittance while heating the substrate to determine the process endpoint.

In yet another embodiment, a method for removing halogen-containing residues from a substrate includes providing a processing system having at least one processing chamber and a chamber that includes a heating element, etching the substrate in the processing chamber with a chemistry comprising bromide, treating the etched substrate in the chamber that includes the heating element, and exposing the substrate to $O_3$ during heating.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention provides a method and system for pre- and or post processing (outside the main etch chamber) at any locations a substrate wafer passes through, en-route, between the main etch chamber and the substrate carrying FOUP without going into a separate chamber which may be dedicated for pre or post processing. The locations that a substrate passes through include and not limited to loadlock chamber and transfer chamber. Further, the present inventions provides a methods and system for an en-route post-processing such as removing halogen-containing residues from a substrate etched using an etchant that includes halogen. It is contemplated that the halogen-containing residues removal process may be performed at any location under vacuum platform in the system. In one embodiment, the halogen-containing residues deposited during substrate etching are removed by a thermal process performed in a vacuum-light platform of a processing system. The portion of the vacuum tight platform that may be utilized to thermally process may include a load lock chamber, a transfer chamber, a processing chamber, on a robot blade, and any other suitable location under vacuum of the processing system between the main etch chamber and the wafer carrying FOUP. The thermal process heats the etched substrate and converts the halogen-containing residues into non-volatile compounds which may be pumped away. The location chosen for performing the halogen-containing residue removal process may be selected "en-route" such that the overall process cycle time is not adversely affected. The invention substantially prevents the environment of the processing system and the substrate from contamination and corrosion while maintaining high productivity and process throughput.

Figure 1:
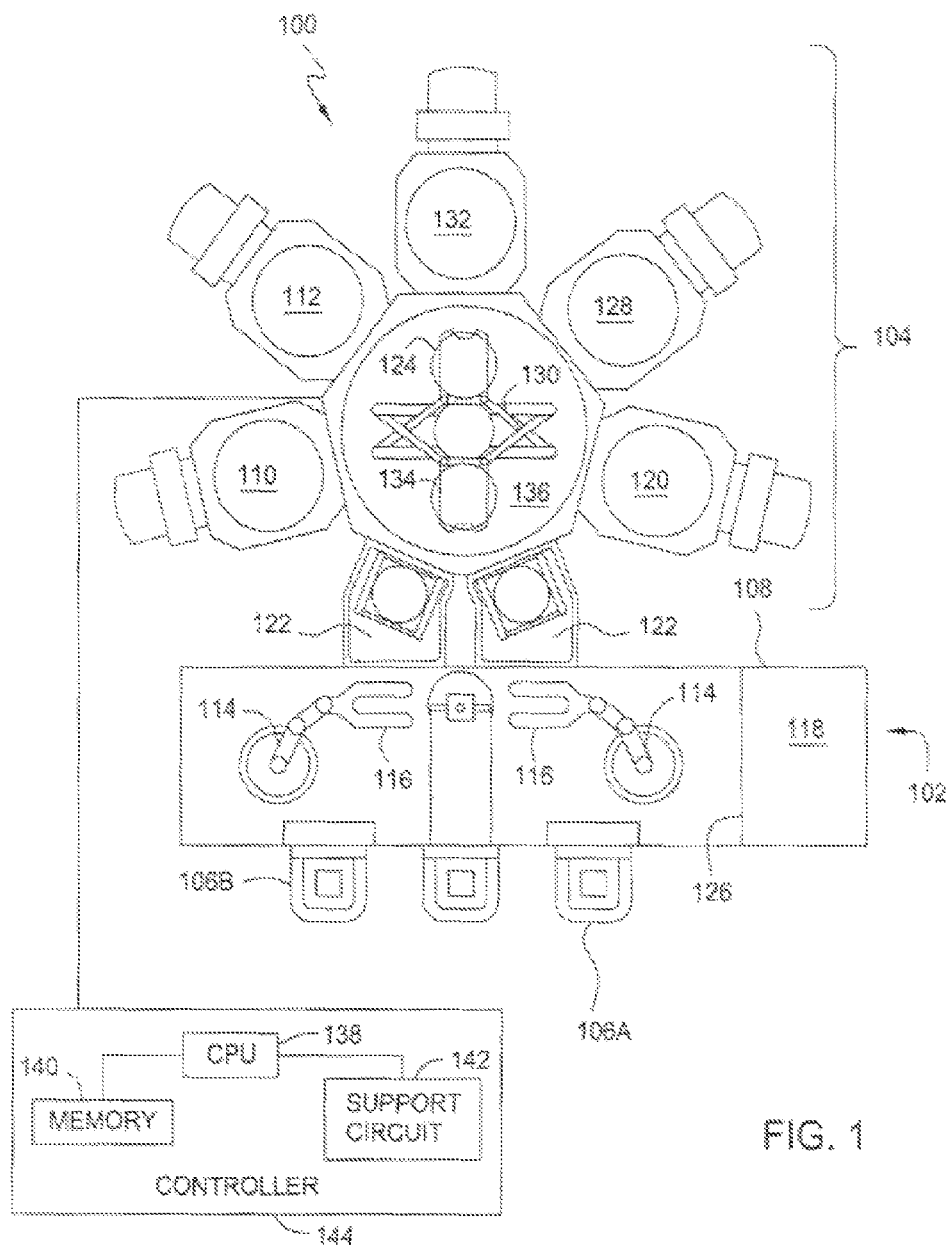
FIG. 1 depicts a schematic diagram of one embodiment of a processing system of the present invention.

FIG. 1 is a schematic, top plan view of one embodiment of a processing system 100 in which a thermal process for removing halogen containing residues may be performed. In one embodiment, the processing system 100 may be a suitably adapted CENTURA® integrated processing system, commercially available from Applied Materials, Inc., located in Santa Clara, Calif. It is contemplated that other processing systems (including those from other manufacturers) may be adapted to benefit from the invention.

The system 100 includes a vacuum-tight processing platform 104, a factory interface 102, and a system controller 144. The platform 104 includes a plurality of processing chambers, shown as processing chambers 110, 112, 132, 128, 120, and at least one load-lock chamber 122 that are coupled to a vacuum substrate transfer chamber 136. Two load lock chambers 122 are shown in FIG. 1. The factory interface 102 is coupled to the transfer chamber 136 by the load lock chambers 122.

In one embodiment, the factor interface 102 comprises at least one docking station 108 and at least one factory interface robot 114 to facilitate transfer of substrates. The docking station 108 is configured to accept one or more front opening unified pod (FOUP). Two FOUPS 106A-B are shown in the embodiment of FIG. 1. The factory interface robot 114 having a blade 116 disposed on one end of the robot 114 is configured to transfer the substrate from the factory interface 102 to the load lock chambers 122 of the processing platform 104. Optionally, one or more metrology stations 118 may be connected to a terminal 126 of the factory interface 102 to facilitate measurement of substrates while within the factory interface 102.

Each of the load lock chambers 122 have a first port coupled to the factory interface 102 and a second port coupled to the transfer chamber 136. The load lock chambers 122 are coupled to a pressure control system (not shown) which pumps down and vents the load lock chambers 122 to facilitate passing the substrate between the vacuum environment of the transfer chamber 136 and the substantially ambient (e.g., atmospheric) environment of the factory interface 102.

The transfer chamber 136 has a vacuum robot 130 disposed therein. The vacuum robot 130 has a blade 134 capable of transferring substrates 124 between the load lock chambers 122 and the processing chambers 110, 112, 132, 128, 120.

In one embodiment, at least one process chambers 110, 112, 132, 128, 120 is an etch chamber. For example, the etch chamber may be a Decoupled Plasma Source (DPS) chamber available from Applied Materials, Inc. The DPS etch chamber uses an inductive source to produce high-density plasma and comprises a source of radio-frequency (RF) power to bias the substrate. Alternatively, at least one of the process chambers 110, 112, 132, 128, 120 may be one of a HART™, E-MAX®, DPS®, DPS II, PRODUCER E, or ENABLER® etch chamber also available from Applied Materials, Inc., or another chamber, including those from other manufacturers. The etch chamber, for example the chamber 110, may use a halogen-containing gas to etch the substrate 124 disposed therein. Examples of halogen-containing gas include hydrogen bromide (HBr), chlorine ($Cl_2$), carbon tetrafluoride ($CF_4$), and the like. After etching the substrate 124, halogen-containing residues may be left on the substrate surface. The halogen-containing residues may be removed by the thermal process described herein. The thermal process may be performed in-situ the platform 104, such as in one of the processing chambers 110, 112, 132, 128, and 120 that are equipped to heat the substrate. The region of the platform 104 in which the thermal process is performed may also include an energy generator and sensor arranged to monitor the substrate during the thermal process so that the substrate temperature may be monitored. In an exemplary embodiment, the thermal treatment process is performed in the load lock chamber 122, however, the thermal treatment process may be performed in a suitably equipped region of the system 100.

The system controller 144 is coupled to the processing system 100. The system controller 144 controls the operation of the system 100 using a direct control of the process chambers 110, 112, 132, 128, 120 of the system 100 or alternatively, by controlling the computers (or controllers) associated with the process chambers 110, 112, 132, 128, 120 and the system 100. In operation, the system controller 144 enables data collection and feedback from the respective chambers and system controller 144 to optimize performance of the system 100.

The system controller 144 generally includes a central processing unit (CPU) 138, a memory 140, and support circuit 142. The CPU 138 may be one of any form of a general purpose computer processor that can be used in an industrial setting. The support circuits 142 are conventionally coupled to the CPU 138 and may comprise cache, clock circuits, input/output subsystems, power supplies, and the like. The software routines, such as a method 400 for removing halogen-containing residues described below with reference to FIG. 4, when executed by the CPU 138, transform the CPU 138 into a specific purpose computer (controller) 144. The software routines may also be stored and/or executed by a second controller (not shown) that is located remotely from the system 100.

Figure 2:
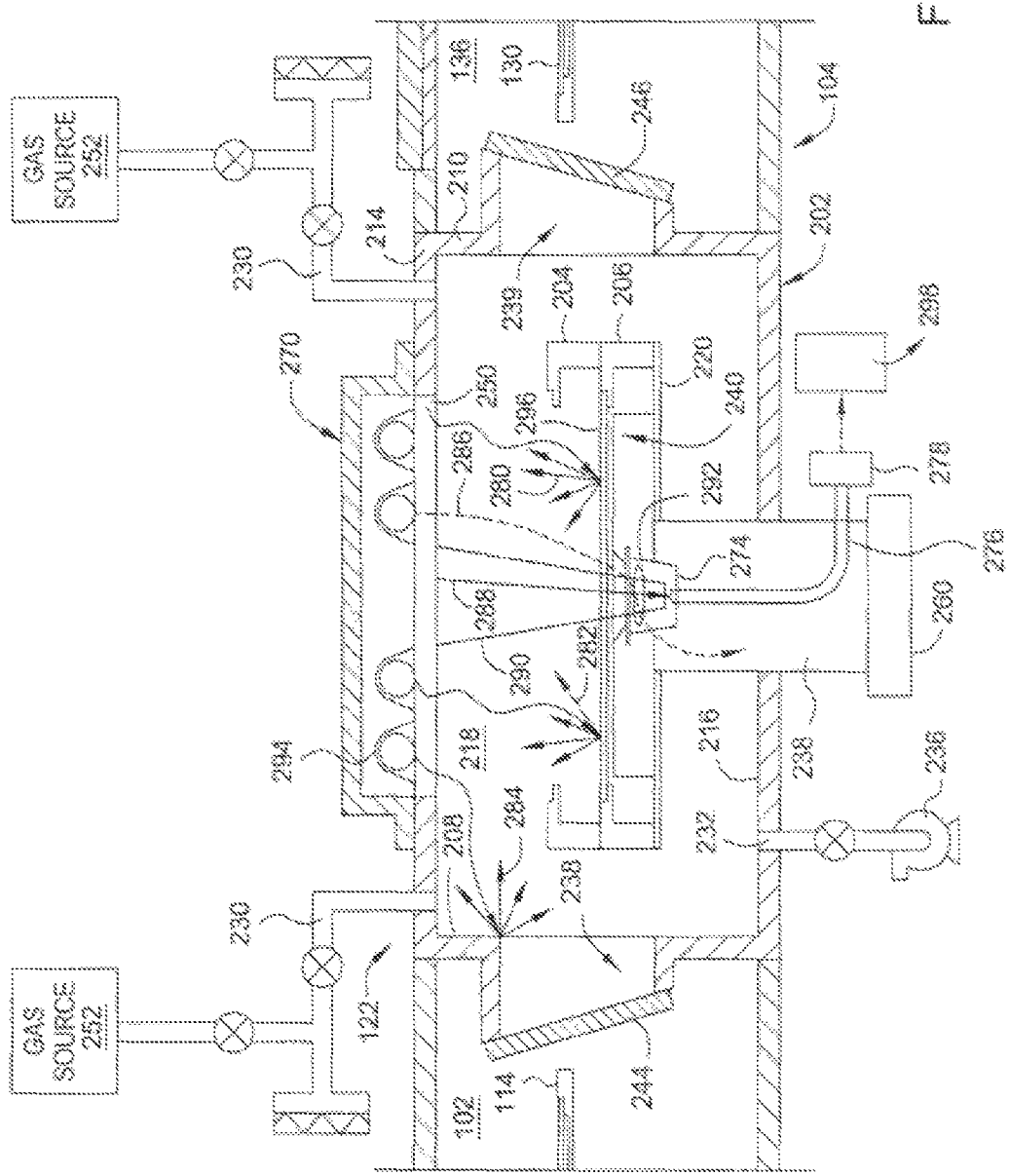
FIG. 2 depicts a sectional view of a load lock chamber of the processing system of FIG. 1.

FIG. 2 depicts one embodiment of the load lock chamber 122 which may be used to perform a thermal process on a substrate. The load lock chamber 122 generally includes a chamber body 202, a first substrate holder 204, a second substrate holder 206, a temperature control pedestal 240 and an energy source, such as a heater module 270. A sensor 298 is disposed within the temperature control pedestal 240. The chamber body 202 may be fabricated from a singular body of material, such as aluminum. The chamber body 202 includes a first side wall 208, a second side wall 210, a top 214 and a bottom 216 that define a chamber volume 218. A window 250, typically comprised of quartz, is disposed in the top 214 of the chamber body 202 and is at least partially covered by the heater module 270. In one embodiment, a plurality of lamps 294 is disposed in the heater module 270 to generate heat for substrate thermal processing. In one embodiment, the lamps 294 are quartz halogen lamps providing infrared radiation having a wavelength between about 700 nm and about 14000 nm. The infrared radiation generated from the lamps 294 may provide heat to the substrate and increase the substrate temperature up to about 500 degrees Celsius. Generally, the wavelength of the sensor 298 is selected to have a high change in transmittance through the materials and/or films being heated in the range of temperature for which measurement is sought, for example, a temperature of a thermal process endpoint.

In one embodiment, the sensor 298 is an InGaAs diode sensor adapted to measure a substrate temperature range between 100 degrees Celsius and about 500 degrees Celsius. The sensor 298 is optically aligned with an optical collimator 292 and a filter 278. The optical collimator 292 is disposed in the pedestal 240 between an end 274 of an optical conduit 276 (i.e., an optical fiber) and the substrate 296. The optical conduit 276 detects collected energy passing through substrate 296 and collimator 292 to the filter 278. The filter 278 is adapted to filter the signal collected from the optical collimator 292 and only provides IR light with a desired wavelength to the sensor 298.

In one embodiment, the optical collimator 292 has an aperture selected to allow energy to enter the optical conduit 276 which is incident to the substrate at a predefined angle 290 selected to minimize the entry of scattered energy and other noise into the conduit 276. For example, the selected angle 290 of the optical collimator 292 only allows light 288 passing through the substrate at within a cone defined by the angle 290 to be collected, and prevents light incident at to the substrate at angles outside of the selected angle 290 from entering into the optical conduit 276. The unwanted reflected light from the chamber wall 284 and/or noise generated from the background 282, 280 may be prevented from interfering with the signal entering to optical conduit 276 through the collimator 292 and ultimately reaching the sensor 298 through the filter 278. The light energy reaching to the sensor 298 is then further analyzed to calculate the temperature of the substrate 296.

The pressure of the chamber volume 218 may be controlled so that the load lock chamber 122 may be evacuated to substantially match the environment of the transfer chamber 136 and be vented to substantially match the environment of the factory interface 102. The chamber body 202 includes one or more vent passages 230 and a pump passage 232 to provide laminar flow within the chamber volume 218 during venting and evacuation to minimize particulate contamination. The vent passage 230 may be additionally coupled to a gas source 252 to provide a gas mixture into the chamber volume 218. Examples of gases that may be supplied from the gas source 252 include nitrogen ($N_2$), argon (Ar), hydrogen ($H_2$), alkanes, alkenes, helium (He), oxygen ($O_2$), ozone ($O_3$), wafer vapor ($H_2O$), and the like. The pump passage 232 is coupled to a pump 236 to pump-down the gases and control the pressure of the load lock chamber 122 at a desired point.

A first loading port 238 is disposed in the first wall 208 of the chamber body 202 to allow the substrate 296 to be transferred between the load lock chamber 122 and the factory interface 102. A first slit valve 244 selectively seals the first loading port 238 to isolate the load lock chamber 122 from the factory interface 102. A second loading port 239 is disposed in the second wall 210 of the chamber body 202 to allow the substrate 296 to be transferred between the load lock chamber 122 and the transfer chamber 136. A second slit valve 246 which is substantially similar to the first slit valve 244 selectively seals the second loading port 239 to isolate the load lock chamber 122 from the vacuum environment of the transfer chamber 136.

The first substrate holder 204 is concentrically coupled to (i.e., stacked on top of) the second substrate holder 206 that is disposed above the chamber bottom 216. The substrate holders 204, 206 are generally mounted to a hoop 220 that is coupled to a shaft 258 that extends through the bottom 216 of the chamber body 202. Each substrate holder 204, 206 is configured to retain one substrate. The shaft 258 is coupled to a lift mechanism 260 disposed exterior to the load lock chamber 122 that controls the elevation of the substrate holders 204 and 206 within the chamber body 202. The first substrate holder 204 is utilized to hold an unprocessed substrate from the factory interface 102 while the second substrate holder 206 is utilized to hold a processed substrate (e.g., an etched substrate) returning from the transfer chamber 136. In embodiment depicted in FIG. 2, a processed substrate 296 is positioned on the second substrate holder 206 after processing at any one of the processing chamber, 110, 112, 132, 128 and 120.

Figure 3:
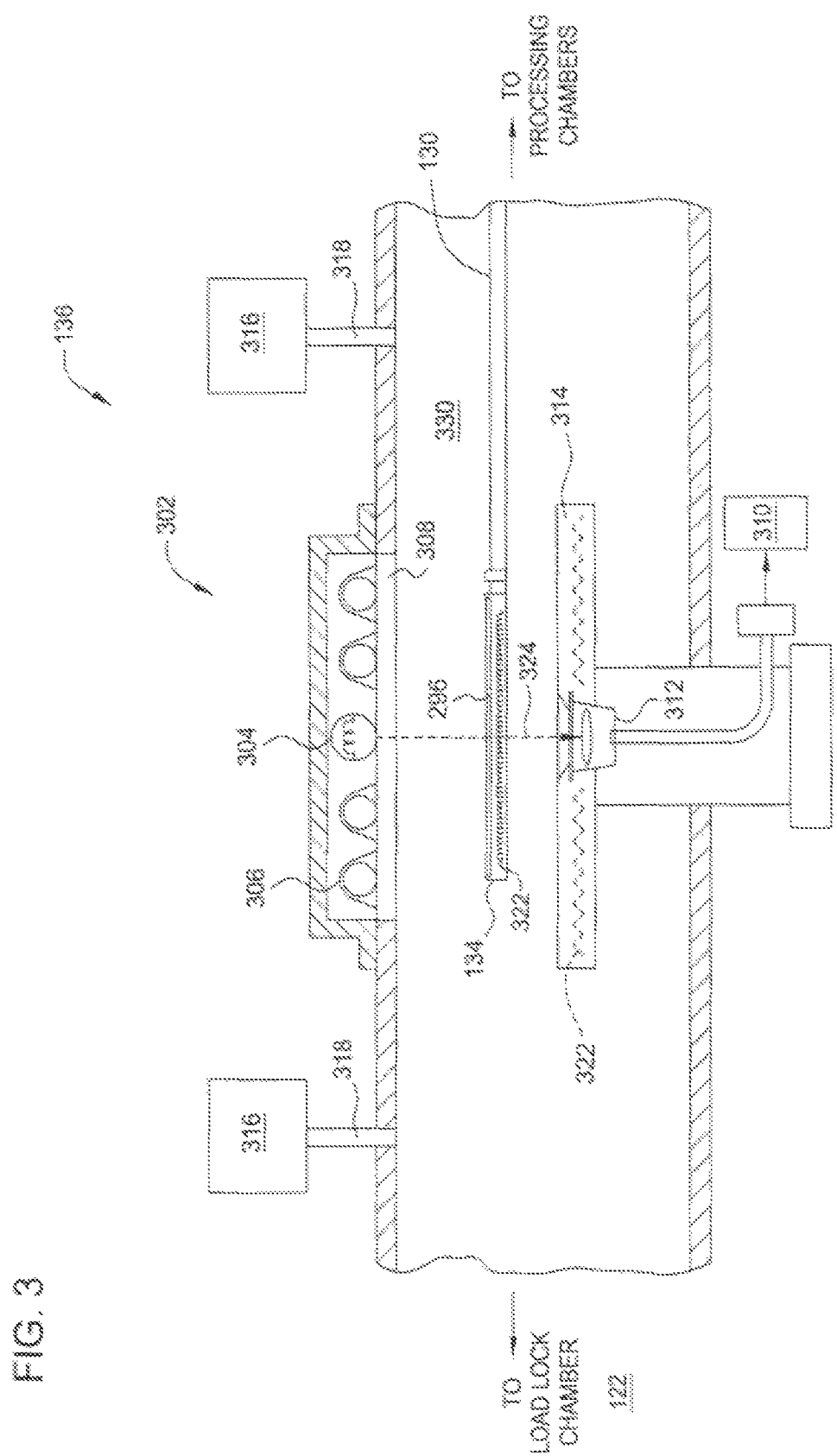
FIG. 3 depicts a partial sectional view of a transfer chamber of the processing system of FIG. 1.

FIG. 3 depicts a partial sectional view of the transfer chamber 136 of the processing system 100 of FIG. 1. In the embodiment depicted in FIG. 3, the transfer chamber 136 is configured to thermally process the substrate so that volatile residues may be released from the substrate. The substrate disposed in the transfer chamber 136 may be heated by any suitable is heater or energy source. In one example, the substrate may be heated by a resistive heating element 322 embedded in the blade 134 of the transfer chamber robot 130. In another embodiment, the substrate may be heated by a heater module 302 disposed in, on top of transfer chamber 136, or below the transfer chamber 136. The heater module 302 may include one or more lamps 306 suitable for heating the substrate. In yet another embodiment, the substrate may be heated by a heated pedestal 314 disposed in the transfer chamber 136. The pedestal 314 may include a resistive heater 350 or other suitable heating device. It is contemplated that the substrate may be heated by other methods within the transfer chamber 136 or other portion of the system 100 that is under vacuum.

During heating of the substrate, the substrate may be exposed to one or more gases that facilitate the release of the volatiles from the substrate, and removal of the released volatiles from the system. In the embodiment depicted in FIG. 3, the transfer chamber 136 includes gas passages 318 adapted to supply different process gases from a gas source 316 to an interior volume 330 of the transfer chamber 136. Examples of gases that may be supplied from the gas source 316 include nitrogen ($N_2$), argon (Ar), hydrogen ($H_2$), alkanes, alkenes, helium (He), oxygen ($O_2$), ozone ($O_3$), wafer vapor ($H_2O$), and the like.

Optionally, the transfer chamber 136 may be equipped to sense the temperature of the substrate during heating. In one embodiment, an energy generator 304 is disposed on the top of the transfer chamber 136 which provides an energy signal that is transmitted through the substrate 296 to a sensor 310. The energy generator 304 may be a laser, broad beam light source or other suitable wave generator, and in one embodiment, the generator 304 may be one of the lamps 306.

A collimator 312 may be disposed below the substrate 296 to collect energy transmitted within a predefine incidence angle through the substrate 296 from generator 304. The energy transmitted through the substrate 296 and collected by the collimator is subsequently transmitted to the sensor 310 by a fiber optic conduit for determining the temperature of the substrate, as described above with reference to FIG. 2.

Figure 4:
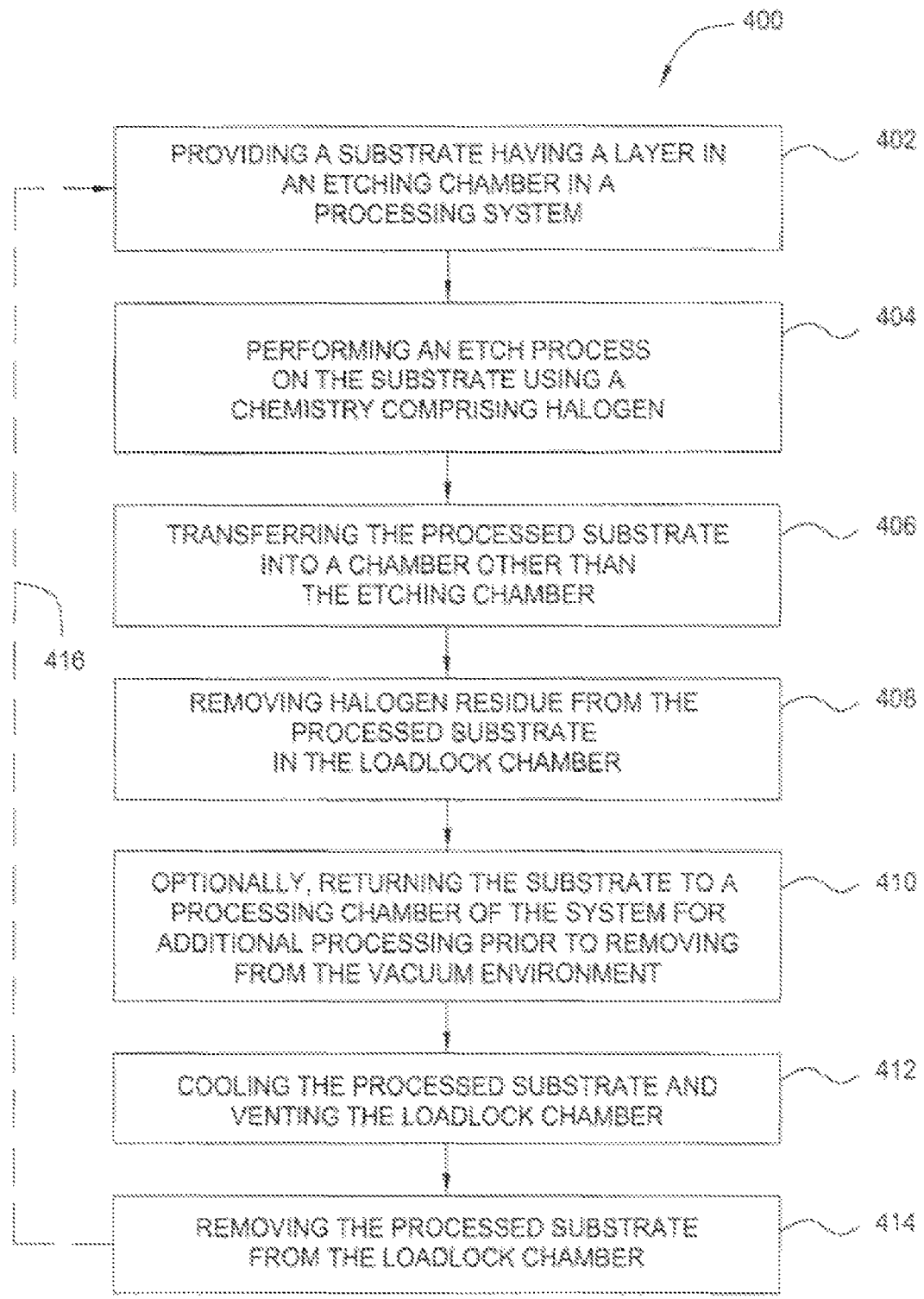
FIG. 4 depicts a process diagram illustrating a method for removing halogen-containing residues on a substrate according to one embodiment of the present invention.

FIG. 4 depicts a flow diagram of a method 400 for removing a halogen-containing residue from a substrate in accordance with the present invention. The method 400 is performed in the processing apparatus 100 of FIG. 1. It is contemplated that the method 400 may be performed in other suitable processing systems, including those from other manufacturers.

The method 400 begins at step 402 by providing a substrate having a layer disposed thereon to an etch chamber, such as one of the etch chambers 110, 112, 132, 128 and 120, in the processing system 100 to perform an etch process. The factory interface robot 114 transfers the substrate to be processed from one of the FOUPs 106A-B to the first substrate holder 204 in the load lock chamber 122. The substrate may be any substrate or material surface upon which film processing is performed. In one embodiment, the substrate may have a layer or layers formed thereon utilized to form a structure, such as a gate structure. The substrate may alternatively utilize a mask layer as an etch mask and/or etch stop layer disposed on the substrate to promote the transfer of the features or structures to the substrate. In another embodiment, the substrate may have multiple layers, e.g., a film stack, utilized to form different patterns and/or features, such as dual damascene structure and the like. The substrate may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire, metal layers disposed on silicon and the like. The substrate may have various dimensions, such as 200 mm or 300 mm diameter wafers, as well as, rectangular or square panels. In embodiment depicted in the present invention, the substrate may be a silicon semiconductor substrate.

In one embodiment, the substrate transferred to the load lock chamber 122 may be preheated to a predetermined temperature by the heater module 270 or by the temperature controlled pedestal 240 in the load lock chamber 122. In another embodiment, the substrate is preheated while on the blade of the transfer chamber robot 130. In one embodiment, the substrate may be preheated to a temperature between about 20 degrees Celsius and about 400 degrees Celsius. After the pressure within the load lock chamber 122 and the transfer chamber 136 are substantially equal, the vacuum robot 130 transfers the substrate to one of the processing chambers, for example, chamber 110, to perform the etch process.

At step 404, the substrate is etched in the processing chamber 110 to form desired features and patterns on the substrate. In embodiments which the substrate has mask layers disposed on the substrate surface, the etch process etches the mask layers simultaneously while forming the desired features and patterns.

In one embodiment, the substrate is etched by supplying a gas mixture having at least a halogen-containing gas. Suitable examples of halogen-containing gas include, but not limited to, hydrogen bromide (HBr), chlorine ($Cl_2$), carbon tetrafluoride ($CF_4$), and the like. In an exemplary embodiment suitable for etching polysilicon, the gas mixture supplied to the processing chamber 110 provides a gas mixture including hydrogen bromide (HBr) and chlorine ($Cl_2$) gas at a flow rate between about 20 sccm and about 300 sccm, such as between 20 sccm and about 60 sccm, for example about 40 sccm. An inert gas may be supplied with the gas mixture to the processing chamber 110. Suitable examples of inert gas may include nitrogen ($N_2$), argon (Ar), helium (He) and the like. In one embodiment, the inert gas, such as $N_2$, may supplied with the gas mixture at a flow rate between about 0 sccm and about 200 sccm, such as between about 0 sccm and about 40 sccm, for example about 20 sccm. A reducing gas, such as carbon monoxide (CO) may be supplied with the gas mixture. The plasma power for the etch process may be maintained between about 200 Watts and about 3000 Watts, such as about 500 Watts and about 1500 Watts, for example about 1100 Watts, and the bias power may be maintained between about 0 Watts and about 300 Watts, such as about 0 Watts and about 80 Watts, for example about 20 Watts. The process pressure may be controlled at between about 2 mTorr and about 100 mTorr, such as between about 2 mTorr and about 20 mTorr, for example about 4 mTorr, and the substrate temperature may be maintained at between about 0 degrees Celsius and about 200 degrees Celsius, such as between about 0 degrees Celsius and about 100 degrees Celsius, for example about 45 degrees Celsius.

During etching process, the etched materials may combine with the components of the etchant chemistry, as well as with the components of the mask layers, if any, and by-products of the etch process, thereby forming halogen-containing residues. In one embodiment, the materials on the substrate to be etched may include photoresist layer, hard mask layer, bottom anti-reflective coating (BARC), polysilicon, crystalline silicon, gate oxide, metal gate, such as titanium nitride (TiN), and high-k materials, such as aluminum oxide ($Al_2O_3$), hafnium containing oxide. Suitable examples of hard mask layer include silicon nitride, TEOS, silicon oxide, amorphous carbon, and silicon carbide. The halogen-containing residues deposit on the surfaces of the substrate. The halogen-containing residue may release (e.g., outgas) gaseous reactants, such as bromine ($Br_2$), chlorine ($Cl_2$), hydrogen chloride (HCl), hydrogen bromine (HBr) and the like, if exposed to atmospheric pressures and/or water vapor. The release of such reactants may cause corrosions and particle contamination of the processing apparatus and factor interfaces during substrate transfer, such as the vacuum-tight processing platform 104 and the factory interface 102 as described in FIG. 1. In embodiments where metallic layers, such as Cu, Al, W, are exposed to the substrate surface, the metallic layer may be corroded by the released gaseous reactants if they are not removed by the inventive process described below, thereby adversely deteriorating the performance of devices formed on the substrate.

Halogens may also be present on the surface of substrates that are processed in a vacuum environment in a manner other than etching. Therefore, it is contemplated that halogens may be removed from those substrates using the applicable portion of this method described below.

At step 406, the processed (e.g., etched) substrate is removed from the etching processing chamber 110 after the completion of the process. The processed (e.g., etched) substrate may be subsequently transferred to any chamber in the processing system 100 other than the etching chamber performing the etching process to perform a thermal process as further described below. For example, as the etched may be subsequently transferred to a thermal chamber including any one of the other processing chambers 112, 132, 128, 120, transfer chamber 136, load lock chamber 122 or other parts in the platform 104 wherein the substrate may be heated to release the halogens. Optionally, the thermal process may occur in the factory interface 102, metrology stations 118. The processed (e.g., etched) substrate is thermally treated at step 408 to remove the halogen-containing residues from the substrate generated during step 404 prior to exposure to atmospheric conditions or water vapor in the FOUPs 106A-B or other location. It is also contemplated that step 406 may be omitted and the thermal process step 408 described below may be performed in the chamber in which the substrate was etch or otherwise exposed to halogens.

At step 408, the substrate is thermally processed to remove halogen and/or halogen-containing residues from the substrate. In one embodiment, step 406 may be performed while the substrate is disposed on one of the robots 114, 130 having a heating element or configured to position the substrate in close enough to a heater suitable for heating the substrate to a temperature at which the volatiles are released. For example, the thermal treatment process of step 408 may be performed while the substrate is disposed on the transfer robot 130 during the sequence of transferring the substrate between chambers. Alternatively, the substrate at step 408 may be positioned in a substrate supporting device while the thermal process is performed. In one embodiment, the thermal process of step 408 may be performed in the load lock chamber 122 or other similarly configured region of the transfer chamber 136 or one of the processing chambers 112, 132, 128, 120. In the exemplary description below, the step 408 is described as performed in the load lock chamber 122. It is contemplated that the heating step and optionally at least on of the gas exposure and sensing step may be performed in other suitable equipped regions of the platform 104 or factory interface 102.

In the exemplary embodiment of step 408, the thermal treatment process is performed in the load lock chamber 122 to remove the halogen-containing residues from the etched substrate surface. The etched substrate held by the second substrate holder 206 raises the substrate 296 toward the heater module 270, thereby increasing the intensity of heat transfer to the substrate. The heat from the heater module 270 causes the temperature of the surface of the substrate to rise, thereby causing halogen-based reactants disposed on the etched substrate surface to be released and/or outgassed. As the substrate temperature increases, the light energy absorption behavior of the silicon substrate varies as well. For example, as the light from the heat module 270 heats the silicon substrate and the substrate temperature elevates, the absorption of the light energy by the substrate increases due to high light energy absorption of silicon material at high substrate temperature. Thus, less light is transmitted through the silicon substrate as it heats. By measuring the change in substrate transmittance by the sensor 298, the substrate temperature may be calculated and a process endpoint to control the substrate temperature during thermal treatment process can be determined.

In one embodiment, the heater module 270 heats the substrate to a temperature between about 20 degrees Celsius and about 500 degrees Celsius, such as between about 150 degrees Celsius and about 400 degrees Celsius, for example about 300 degrees Celsius, at between about 5 seconds and about 120 seconds, such as about 20 seconds. The rapid heating of the substrate by heater module 270 allows the halogen-containing residues on the etched substrate to be removed without increasing process cycle time. In one embodiment, the substrate may be heated by the heater module 270 at a predetermined time period until the halogen-containing residues on the etched substrate are removed therefrom. Alternatively, endpoint may be detected by monitoring substrate temperature, for example, monitoring a change in light transmission through the substrate.

In one embodiment, a gas mixture may be supplied from the gas source 252 to the load lock chamber 122 while heating the etched substrate. The etched substrate is exposed to and reacts with the gas mixture. The gas mixture converts the outgassed halogen-based reactants into non-corrosive volatile compounds that are pumped out of the load lock chamber 122. The gas mixture may include an oxygen-containing gas, such as $O_2$, $O_3$, water vapor ($H_2O$), a hydrogen-containing gas, such as $H_2$, forming gas, water vapor ($H_2O$), alkanes, alkenes, and the like, or an inert gas, such as a nitrogen gas ($N_2$), argon (Ar), helium (He), and the like. For example, the gas mixture may include oxygen, nitrogen, and a hydrogen-containing gas. In one embodiment, the hydrogen-containing gas is at least one of hydrogen ($H_2$) and water vapor ($H_2O$). In another example, the gas mixture may include ozone gas ($O_3$). In embodiments which mask layers is present on the substrate, the mask layers may be simultaneously removed with the halogen-containing residues, e.g., the mask is stripped of the photoresist in the load lock chamber.

In one embodiment, the gas mixture may be supplied at a flow rate between about 100 sccm and about 10,000 sccm, for example about 7000 sccm. In embodiments where the halogen-containing residues are mostly bromine-based residues resulting from use of bromine-based etching chemistry, the gas mixture may include ozone gas ($O_3/O_2$) and/or other inert gas_such as O2 and N2. The ozone gas ($O_3/O_2$) may be supplied at a flow rate at between about 100 sccm and about 10,000 sccm, for example about 7000 sccm. Alternatively, the inert gas may be supplied with the ozone gas ($O_3/O_2$) at a flow rate at between about 100 sccm and about 10,000 sccm, such as about 500 sccm. A residual gas analyzer (RGA) may be utilized to detect the remaining halogen-containing residues on the etched substrate surface.

Optionally, a step 410 may be performed wherein the thermally treated substrate is returned to one of the processing chamber 110, 112, 132, 128, 120 of the system for additional processing prior to removing from the vacuum environment. The substrate, after the halogen removal process of step 408, will not introduce halogens into the processing chambers during subsequent processing, thereby preventing damage to the processing chambers.

At an optional step 412, the thermal treated substrate is cooled in the load lock chamber 122. At step 412, the temperature control pedestal 240 is raised to contact the etched substrate supported on the second substrate holder 206 after the halogen residue removal step 408 to cool the substrate to a desired temperature. The etched substrate is cooled by transferring heat through the pedestal 240. In one embodiment, the etched substrate may be cooled to a temperature ranging between about 10 degrees Celsius and about 125 degrees Celsius that allows the etched substrate returning to the FOUPs 106A-B without causing damage to the FOUPs 106A-B.

While cooling the substrate at step 412, the load lock chamber 122 may be simultaneously vented in preparation for the subsequent substrate transfer process at step 414 to minimize process cycle time. Once the pressures of the load lock chamber 122 and the factory interface 102 are matched, the first slit valve 244 is opened to allow the factory interface robot 114 to access the load lock chamber 122 to remove the etched substrate from the load lock chamber 122 and return to one of the FOUPs 106A-B as performed at step 414. A newly unprocessed substrate from the FOUPs 106A-B may be transferred into the load lock chamber 122 on the first substrate holder 204 while the etched substrate is removed from the second substrate holder 206, thereby 4 consecutively processing substrates as indicated by the loop 416 depicted in FIG. 3. Alternatively, in embodiment where thermal treatment process of the etched substrate is performed in a region of the platform 104 other than the load lock chamber 122, the etched substrate is moved to the load lock chamber 122 or one of the processing chambers 132, 128, 120 after completion of the step 408.

Thus, the present invention provides a method and apparatus for removing halogen and/or halogen-containing residues from a substrate. The method and apparatus advantageously prevents contamination and corrosion of exposed portions of metallic films deposited on the substrate, along with preventing contamination and corrosion of the processing system from by released halogens, thereby enhancing productivity and process throughput.

While the foregoing is directed to embodiments of the present invention, other and further embodiments of the invention may be devised without departing from the basic scope thereof, and the scope thereof is determined by the claims that follow.

The invention claimed is:

1. A method for removing volatile residues from a substrate, comprising:
   providing a processing system having a vacuum tight platform, the vacuum tight platform comprising a transfer chamber coupled to a plurality of processing chambers and a load lock chamber, wherein the transfer chamber facilitates transfer of the substrate from the processing chamber to a load lock chamber, and wherein the load lock chamber is configured to transfer the substrate from an ambient environment outside the platform to a vacuum environment inside the transfer chamber;
   processing a substrate in one of the processing chambers of the platform with a chemistry comprising halogen; and
   removing volatile residues from the processed substrate by heating the processed substrate while on a blade of a robot disposed in the transfer chamber of the platform.

2. The method of claim 1, wherein processing treating the substrate further comprises:
   exposing the substrate to halogen containing gases including hydrogen bromide.

3. The method of claim 1, wherein removing volatile residues further comprises:
   heating the processed substrate to a temperature between about 20 degrees Celsius and about 500 degrees Celsius.

4. The method of claim 1, wherein removing volatile residues further comprises:
   exposing the processed substrate to a gas selected from at least one of $O_2$, $O_3$, $H_2O$, and $H_2$.

5. The method of claim 4, wherein exposing the processed substrate $O_3$ further comprises:
   exposing the substrate to an inert gas.

6. The method of claim 5, wherein the inert gas is at least one of nitrogen gas ($N_2$), argon (Ar) and helium (He).

7. The method of claim 4, wherein exposing the processed substrate to the gas further comprises:
   supplying the gas at a flow rate between about 100 sccm and about 10000 sccm.

8. The method of claim 4, wherein exposing the processed substrate further comprises:
   exposing the processed substrate to the gas between about 5 seconds and about 120 seconds.

9. The method of claim 1, wherein removing volatile residues further comprises:
   exposing the substrate to $O_3$ while heating the substrate.

10. The method of claim 1, wherein removing volatile residues further comprises:
    maintaining a pressure at between about 5 Torr and about 300 Torr while heating the substrate.

11. The method of claim 1, further comprising:
    sensing a change in a signal passing through the substrate while heating the substrate on the blade.

12. The method of claim 11, wherein sensing a change in the signal further comprises:
    determining a substrate temperature correlating to the signal change.

13. The method of claim 12, further comprising:
    terminating heating of the substrate when a predetermined temperature is reached.

14. The method of claim 1, wherein processing treating the substrate further comprising:
    etching the substrate using at least one of hydrogen bromide (HBr), chlorine ($Cl_2$), and carbon tetrafluoride ($CF_4$).

15. The method of claim 1, wherein removing volatile residues occurs while the substrate is moving.

16. A method for removing halogen-containing residues from a substrate, comprising:
    providing a processing system having a plurality of processing chambers, a transfer chamber and a substrate heater disposed outside the processing chamber, wherein the transfer chamber is coupled to the plurality of processing chambers;
    etching the substrate in one of the processing chambers with a chemistry comprising a halogen;
    exposing the etched substrate to a gas selected from at least one of $O_2$, $O_3$, $H_2O$, and $H_2$ while treating the etched substrate inside the transfer chamber with the substrate heater while in the processing system to release volatile residues from the substrate; and
    detecting a change of substrate transmittance while heating the substrate.

17. The method of claim 16, wherein detecting the change of substrate transmittance further comprises:
    determining an end point for the heating process.

18. The method of claim 16, wherein etching the substrate further comprises:
    exposing the substrate to a halogen containing gas including bromide.

19. The method of claim 16, wherein treating the etched substrate further comprises:
    exposing the substrate to $O_3$ while heating the substrate.

20. The method of claim 16, wherein the treating the etched substrate further comprises:
    exposing the substrate to IR light.

21. The method of claim 20, wherein treating the etched substrate further comprises:
    sensing a change in the IR light transmitted through the substrate.

22. The method of claim 16, wherein exposing the etched substrate inside the transfer chamber further comprises:
    supporting the substrate on a blade of a robot.

23. The method of claim 16, wherein exposing the etched substrate inside the transfer chamber further comprises:
moving the substrate within the transfer chamber on a blade of a robot.

24. A method for removing halogen-containing residues from a substrate, comprising:
providing a processing system having at least one processing chamber, a load lock chamber and a transfer chamber configured for heating a substrate therein, wherein the transfer chamber facilitates transfer of the substrate from the processing chamber to the load lock chamber, and wherein the load lock chamber is configured to transfer the substrate from an ambient environment outside the platform to a vacuum environment inside the transfer chamber;
etching the substrate in the processing chamber with a chemistry comprising bromide;
treating the etched substrate in the transfer chamber configured for heating the substrate; and
exposing the substrate to $O_3$ during heating.

25. The method of claim 24, further comprising:
exposing the substrate to light while heating the substrate; and
determining a temperature of the substrate by monitoring changes in the light transmitting through the substrate.

26. The method of claim 25, wherein the light is generated by a least one of a laser of a heating lamp or a broadband light source.

27. The method of claim 24, wherein treating the etched substrate inside the transfer chamber further comprises:
supporting the substrate on a blade of a robot.

* * * * *

UNITED STATES PATENT AND TRADEMARK OFFICE
CERTIFICATE OF CORRECTION

| | | |
|---|---|---|
| PATENT NO. | : 7,846,845 B2 | Page 1 of 1 |
| APPLICATION NO. | : 11/676161 | |
| DATED | : December 7, 2010 | |
| INVENTOR(S) | : Bahng et al. | |

It is certified that error appears in the above-identified patent and that said Letters Patent is hereby corrected as shown below:

In the Background of the Invention:

Column 2, Line 6, please insert --,-- after example;

In the Detailed Description:

Column 3, Line 23, please delete "vacuum-light" and insert --vacuum-tight-- therefor;

Column 3, Line 58, please delete "factor" and insert --factory-- therefor;

Column 7, Line 13, please delete "predefine" and insert --predefined-- therefor;

Column 8, Line 56, please delete "factor" and insert --factory-- therefor;

Column 9, Line 26, please delete "406" and insert --408-- therefor;

Column 11, Line 24, please insert --substrate-- after prevents.

Signed and Sealed this
Fifteenth Day of March, 2011

David J. Kappos
*Director of the United States Patent and Trademark Office*